(12) United States Patent
Schulze

(10) Patent No.: US 6,271,545 B1
(45) Date of Patent: Aug. 7, 2001

(54) ASYMMETRICAL THYRISTOR WITH BLOCKING/SWEEP VOLTAGE INDEPENDENT OF TEMPERATURE BEHAVIOR

(75) Inventor: Hans-Joachim Schulze, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/355,061
(22) PCT Filed: Jan. 28, 1998
(86) PCT No.: PCT/DE98/00248
§ 371 Date: Jul. 22, 1999
§ 102(e) Date: Jul. 22, 1999
(87) PCT Pub. No.: WO98/34282
PCT Pub. Date: Aug. 6, 1998

(30) Foreign Application Priority Data

Jan. 31, 1997 (DE) .............................................. 197 03 673

(51) Int. Cl.⁷ .................................................. H01L 29/74
(52) U.S. Cl. .......................... 257/107; 257/139; 257/143; 257/144; 257/147; 257/149; 257/152; 257/153
(58) Field of Search ..................................... 257/139, 143, 257/144, 147, 149, 152, 153, 107

(56) References Cited

U.S. PATENT DOCUMENTS

| | | | |
|---|---|---|---|
| 4,642,669 | * | 2/1987 | Roggwiller et al. ................ 357/52 |
| 4,689,647 | * | 8/1987 | Nakagawa et al. ................ 357/23.4 |
| 4,717,947 | * | 1/1988 | Matsuda et al. ................ 357/38 |
| 5,352,910 | * | 10/1994 | Muraoka et al. ................ 257/148 |
| 5,644,149 | * | 7/1997 | Streit ................ 257/147 |

FOREIGN PATENT DOCUMENTS

0108961 * 5/1984 (EP) .

OTHER PUBLICATIONS

Patent Abstracts of Japan, vol. 011, No. 33 (E–476), Jan. 30, 1987, & JP 61 202465, Sep. 08, 1986, Toshiba Corp., Y. Takashi, "Thyristor with Overvoltage Protecting Function", pp. 357–363 (English Abstract attached).
Mitlehner, H. et al, "High Voltage Thyristor for HVDC Transmission and Static Var Compensators", IEEE (1988), pp. 934–939.

* cited by examiner

Primary Examiner—Fetsum Abraham
(74) Attorney, Agent, or Firm—Schiff Hardin & Waite

(57) ABSTRACT

Both the blocking voltage as well as the sweep voltage of conventional thyristors exhibit a pronounced temperature behavior, whereby the corresponding voltage values can change by up to 15% within the relevant temperature range (5° C.–120° C.).

In the proposed thyristor, the overhead triggering is compelled by the "punch through" effect that is independent of the temperature (expanse of the space charge zone allocated to the p-base/n-base junction 10) up to the neighboring n-base/p-emitter junction 11). Due to the laterally non-uniform distribution of the dopant in the n⁺ stop zone (7') of the anode-side base (7), further, it is assured that the central thyristor region always ignites first.

Sweep or punch through voltage is not dependent on the temperature in the asymmetrical thyristors.

5 Claims, 2 Drawing Sheets

ASYMMETRICAL THYRISTOR WITH BLOCKING/SWEEP VOLTAGE INDEPENDENT OF TEMPERATURE BEHAVIOR

BACKGROUND OF THE INVENTION

Both the blocking voltage as well as the sweep voltage (blocking voltage after which the thyristor switches into the conductive condition) of a thyristor exhibit a pronounced temperature behavior. Thus, the blocking and the sweep voltage initially continuously increase with the temperature, reach a maximum, in order to ultimately drop to comparatively low values. Whereas the influence of the positive temperature coefficient of the avalanche coefficients characterizing the electron multiplication by impact ionization predominates at low and moderate temperatures, the drop of the blocking and sweep voltage at higher temperatures $T \geq 100°$ C. can be attributed to the dominance of the positive temperature coefficient of the transistor current gain $\alpha_{pnp}$ as a result of the greatly increasing blocking current. The temperature dependency of the blocking and sweep voltage has an especially disturbing influence in highly inhibiting thyristors that exhibit a protection against overhead ignition integrated in the semiconductor body. Given these thyristors, the blocking and the sweep voltage can change by up to 15% in the relevant temperature range (5° C.–120° C.). For example, the sweep voltage thus rises from $U_{BO}$=8.0 kV to values $U_{BO}\approx$9.2 kV when the thyristor heats from T=23° C. to T=90° C. during operation.

The user must take this effect into account with a more complicated wiring of the thyristor. The manufacturer of the component, by contrast, is compelled to keep the scatter of the parameters (basic doping of the Si substrate, dopant profiles, contour of the edge termination, etc.) that influence the blocking or respectively, sweep voltage extremely low. The product becomes substantially more expensive due to the high technological outlay given simultaneously reduced yield that accompanies this.

SUMMARY OF THE INVENTION

It is an object of the present invention to provide an asymmetrical thyristor whose sweep voltage is not dependent on the temperature or only insignificantly dependent on the temperature. This is achieved by a lateral non-uniform distribution of the dopant in the stop zone of the anode-side base. A stop zone having a comparatively lightly doped central region and a more highly doped outside region can be simply and cost-beneficially manufactured ("masked" implementation).

In general terms the present invention is an asymmetrical thyristor having a semiconductor body provided with a first electrode serving as cathode and with a second electrode serving as anode, whereby the semiconductor body has a plurality of differently doped regions. The doping and position of the regions are prescribed such that the regions form a cathode-side emitter of a first conductivity type, a cathode-side base of a second conductivity type, an anode-side base of the first conductivity type and an anode-side emitter of the second conductivity type. A stop zone of the first conductivity type is located in the anode-side base. The stop zone has a central region lying under a trigger contact or under a light-sensitive structure and a region laterally adjoining thereto. The stop zone is more lightly doped in the central region than in the laterally adjoining region. The anode-side emitter is provided with anode shorts.

Advantageous developments of the present invention are as follows.

The doping of the central region and of the laterally adjoining region of the stop zone are selected such that the space charge zone of the p-junction separating the cathode-side and the anode-side base reaches the anode-side pn-junction only in the central region of the semiconductor body given a predetermined value of the difference between cathode and anode potential.

The metallization arranged on a cathode-side principal surface of the semiconductor body contacts both the cathode-side base as well as an auxiliary emitter of the first conductivity type embedded into the cathode-side base.

The laterally non-uniform distribution of the dopant concentration in the stop zone is effected in that a dopant in the central region of the stop zone is implanted in a dose lower by a factor of 100–5000 than in the laterally adjoining region. In one embodiment the dose of the dopant in the central region of the stop zone is in a range of $0.3-2 \cdot 10^{12}$ cm$^{-2}$.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
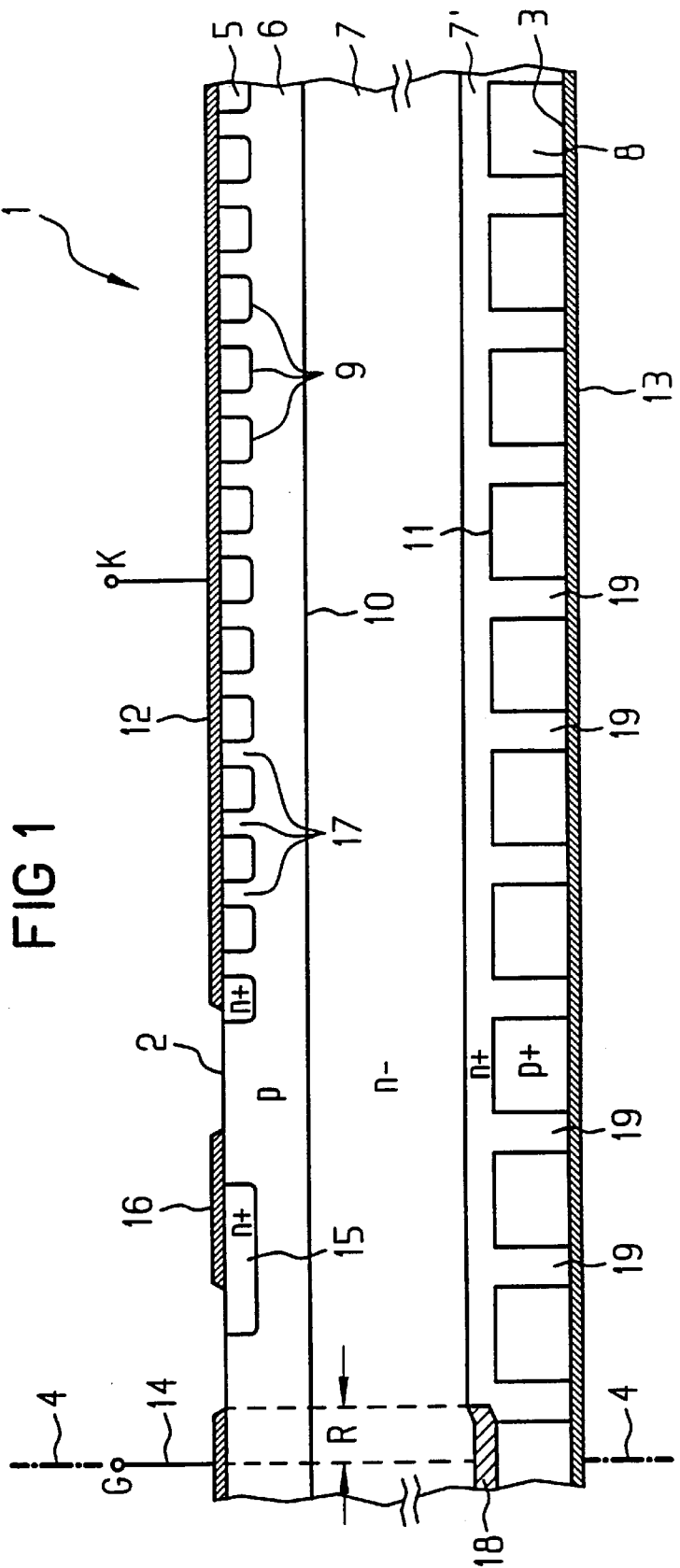
FIG. 1 shows an exemplary embodiment of the inventive thyristor in cross-section.
Figure 2:
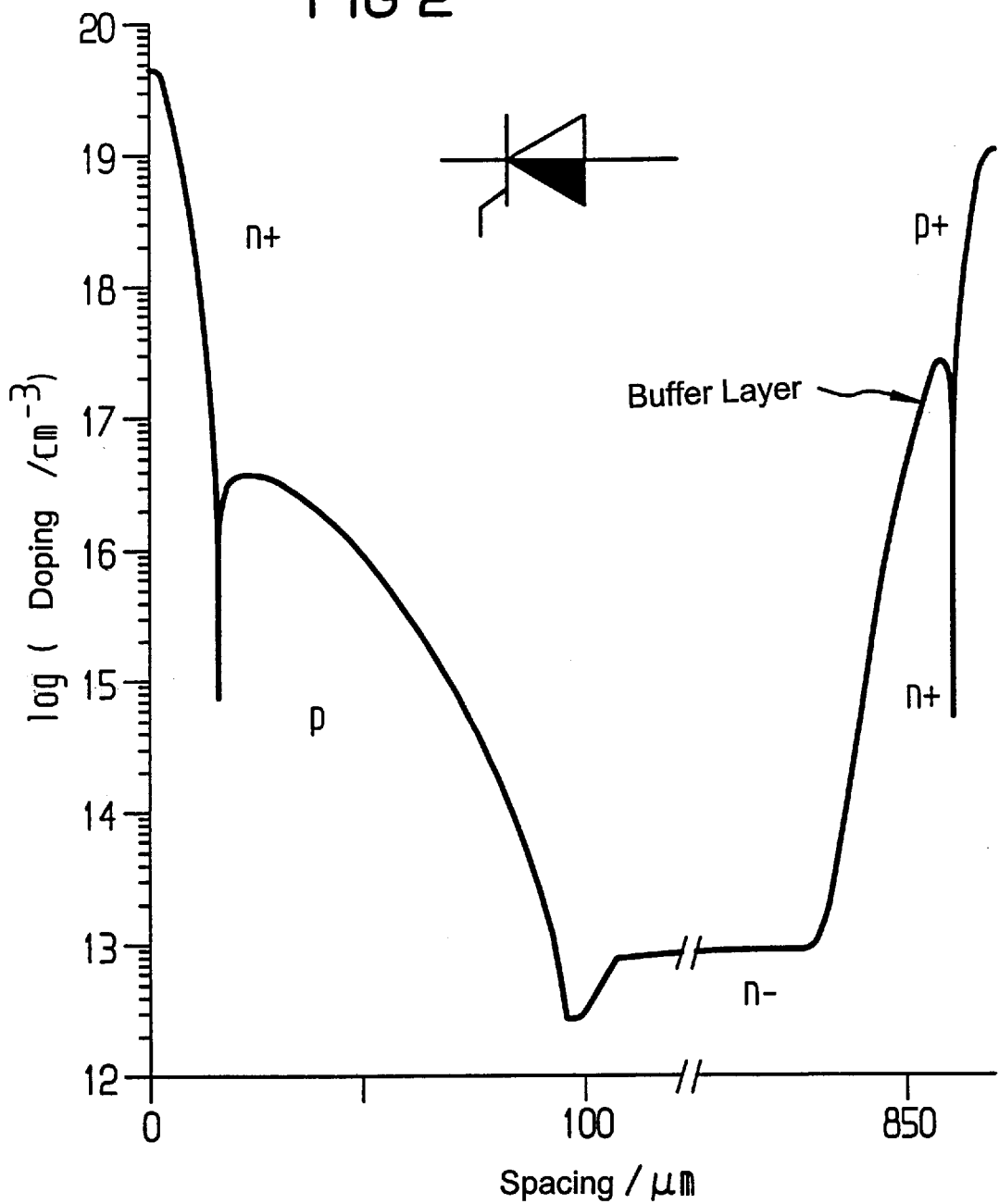
FIG. 2 shows the dopant profile of the asymmetrical thyristor under the cathode metallization.

The thyristor shown in cross-section in FIG. 1 has a dynamically balanced structure with respect to the axis 4 residing perpendicular on the two principal surfaces 2/3 of the semiconductor body 1. The wafer-shaped semiconductor body 1 composed of silicon comprises a plurality of differently doped regions 5–8 respectively separated by pn-junctions 9–11 having the dopant profiles shown in FIG. 2. These regions of different conductivity form the n⁺ emitter 5 contacted by the cathode 12, the cathode-side p-base 6, the only lightly electron-conducting n-base 7 provided with a n⁺ stop zone 7' (buffer layer), as well as the p⁺ emitter 8 of the thyristor contacted by the anode 13. In order to suppress the influence of the leakage current on the transistor gain factor $\alpha_{pnp}$ given low leakage current densities, the p⁺ emitter 8 is advantageously equipped with anode shorts 19. The structure 15/16 arranged between the gate electrode 14 and the cathode 12 is usually referred to as amplifying gate. It is composed of an n⁺ doped region 15 (auxiliary emitter) embedded into the cathode-side base 6 and of a metallization 16 that contacts both the n⁺ doped regions 15 as well as the p base 6. In collaboration with the semiconductor layers lying therebelow and with the anode 13, this structure 15/16 forms an auxiliary or pilot thyristor serving as driver stage for the main thyristor that considerably intensifies the controlled current supplied into the p base 6 via the gate electrode 14. The emitter shorts 17 present in the region of the cathode 12 assure that the thyristor does not already ignite an uncontrolled fashion before the static sweep voltage is reached given a high dU/dt load of a few 1000 V/μs.

Differing from the prior art, the overhead ignition of the inventive thyristor is not compelled by an avalanche but by what is referred to as "punch-through" effect. What is to be understood as "punch through" in this case is the expanse of the space charge zone of the p-base/n-base junction 10 polarized in non-conducting direction up to the neighboring n-base/p-emitter junction 11 polarized in conducting direction and the steep rise of the leakage current resulting therefrom within the semiconductor structure comprising the two pn-junctions 10/11. Since this effect producing the punch-through is essentially dependent only on the basic doping and on the thickness of the n-base 7 and is no longer dependent on the temperature, the sweep voltage also no longer changes or changes only insignificantly in the range of the operating temperatures (5° C.–120° C.). In order to assure that the ignition triggered by "punch-through" begins in the center of the thyristor, the dopant concentration of the n$^+$ stop zone 7' in the area 18 (radius R≈1–3 mm) lying under the gate electrode 14 is clearly reduced compared to the laterally adjoining region of the stop zone 7' that extends up to the wafer edge. The comparatively light doping in the central region 18 of the stop zone 7' means that the space charge zone allocated thereat to the pn-junction 10 expands given application of a high sweep voltage up to the p$^+$ emitter 8, the blocking current consequently increases greatly, and the central thyristor region switches into the conductive condition. Due to the higher doping of the n$^+$ stop 7', by contrast, the space charge zone in the laterally adjoining regions of the component cannot reach the n-base/p-emitter junction 11, this preventing a current rise caused by punch through.

The laterally non-uniform distribution of the dopant in the n$^+$ stop zone 7' can be produced, for example, by a two-stage implantation with donor atoms (usually phosphorous atoms) undertaken at the anode side. The corresponding method is characterized by the following steps:

surface-wide, anode-side implantation of phosphorous ions with a dose of, for example, 0.3 through $2 \cdot 10^{12}$ cm$^{-2}$, which enables punch through;

application of a photoresist or SiO$_2$ layer serving as implantation mask and having the thickness d=1 μm in the central region of the semiconductor body 1;

anode-side, masked implantation of phosphorous ions with a dose or, for example, $3-10 \cdot 10^{14}$ cm$^{-2}$, which prevents punch through;

stripping the photoresist or SiO$_2$ layer; and drive-in of the phosphorous atoms at high temperature (T≈1240° C.) within a time span of approximately 10 through 30 hours.

With a given dopant concentration in the p$^+$ emitter 8, the transistor gain $\alpha_{pnp}$ and, thus, the height of the blocking voltage as well as the pass voltage of the thyristor can be influenced by the doping of the n$^+$ stop zone 7' outside the central region 18 (PESC 88 Record, April 1998, Pages 934–935). It must thereby be taken into consideration, however, that the phosphorous implantation dose that determines the dopant concentration can be varied only within a relatively narrow range in order to assure the required, high blocking voltage ($\alpha_{pnp}$ optimally low) given simultaneously low pass voltage ($\alpha_{pnp}$ optimally high).

The above comments are directed to a gate-controlled thyristor. Of course, the temperature dependency of the sweep voltage of a light-triggerable, asymmetrical thyristor can also be clearly reduced in that the region of the stop zone lying under the radiation-sensitive thyristor structure is more likely doped than the laterally adjoining region.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An asymmetrical thyristor, comprising:
    a semiconductor body having a first electrode serving as cathode and a second electrode serving as anode, and the semiconductor body having a plurality of differently doped regions;
    the differently doped regions being positioned such that the regions form a cathode-side emitter of a first conductivity type, a cathode-side base of a second conductivity type, an anode-side base of the first conductivity type and an anode-side emitter of the second conductivity type;
    a stop zone of the first conductivity type located in the anode-side base;
    the stop zone having a central region, lying under one of a trigger contact or a light-sensitive structure, and a region laterally adjoining thereto;
    the stop zone being more lightly doped in the central region than in the laterally adjoining region; and
    the anode-side emitter being provided with anode shorts.

2. The asymmetrical transistor according to claim 1, wherein the doping of the central region and of the laterally adjoining region of the stop zone are selected such that a space charge zone of a p-junction separating the cathode-side base and the anode-side base reaches an anode-side pn-junction only in the central region of the semiconductor body given a predetermined value of a difference between cathode potential and anode potential.

3. The asymmetrical thyristor according to claim 1, wherein metallization arranged on a cathode-side principal surface of the semiconductor body contacts both the cathode-side base and an auxiliary emitter of the first conductivity type embedded into the cathode-side base.

4. The asymmetrical thyristor according to claim 1, wherein a laterally non-uniform distribution of dopant concentration in the stop zone is effected in that a dopant in the central region of the stop zone is implanted in a dose lower by a factor 100–5000 than in the laterally adjoining region.

5. The asymmetrical thyristor according to claim 4, wherein the dose of the dopant in the central region of the stop zone is in a range of $0.3-2 \cdot 10^{12}$ cm$^{-2}$.

* * * * *